United States Patent [19]

Clemen et al.

[11] 4,406,956
[45] Sep. 27, 1983

[54] FET CIRCUIT FOR CONVERTING TTL TO FET LOGIC LEVELS

[75] Inventors: Rainer Clemen, Böblingen; Walter Fischer, Herrenberg; Werner O. Haug, Böblingen, all of Fed. Rep. of Germany

[73] Assignee: International Business Machines Corporation, Armonk, N.Y.

[21] Appl. No.: 177,298

[22] Filed: Aug. 11, 1980

[30] Foreign Application Priority Data

Sep. 1, 1979 [DE] Fed. Rep. of Germany ....... 2935465

[51] Int. Cl.³ .................. H03K 19/092; H03K 19/094
[52] U.S. Cl. ..................................... 307/475; 307/264
[58] Field of Search ............... 307/264, 448, 475, 482, 307/578

[56] References Cited

U.S. PATENT DOCUMENTS

| | | |
|---|---|---|
| 3,708,689 | 1/1973 | Lattin . |
| 3,710,271 | 1/1973 | Putnam . |
| 3,906,254 | 9/1975 | Lane et al. ......................... 307/264 |
| 4,023,050 | 5/1977 | Fox et al. . |
| 4,129,794 | 12/1978 | Dickson et al. ..................... 307/475 |
| 4,258,272 | 3/1981 | Huang ................................. 307/475 |
| 4,307,308 | 12/1981 | Sano ................................... 307/264 |

FOREIGN PATENT DOCUMENTS 2243671 3/1974 Fed. Rep. of Germany .

OTHER PUBLICATIONS

IEEE Jrnl. of Solid State Circuits, vol. SC-13, No. 3, Jun. 1978; pp. 333-338, E. Arai et al.

*Primary Examiner*—John Zazworsky
*Attorney, Agent, or Firm*—T. E. Galanthay; John A. Jordan

[57] ABSTRACT

This invention relates to a field effect transistor level converter for converting bipolar transistor logic levels to field effect transistor logic levels. First and second field effect transistors have their source and gate electrodes connected in common. The bipolar input signal is received at the common source connection while the gate electrodes receive a fixed reference potential that is equal to the threshold voltage VT plus the lowest possible high binary level of the bipolar input logic. The drain electrode of the first field effect transistor is connected to the output terminal of the level converter and the source electrode of a source follower transistor. The drain electrode of the second transistor is connected to a load device and to the gate of the source follower transistor which has its drain electrode connected to VH. This arrangement produces at the first output terminal a potential swing of approximately 0 to 7 volts in response to an input signal in the range of 0.8 to 2.0 volts.

7 Claims, 2 Drawing Figures

FET CIRCUIT FOR CONVERTING TTL TO FET LOGIC LEVELS

CROSS-REFERENCE TO RELATED APPLICATIONS AND PATENTS

1. German Patent OS No. 22 43 671.
2. Clemen et al, "TTL-Compatible Address Latch With Field Effect Transistors", Ser. No. 66,595, filed Aug. 14, 1979, now U.S. Pat. No. 4,301,381 issued Nov. 11, 1981.

BACKGROUND

1. Field of the Invention

This invention relates to a field effect transistor (FET) circuit for converting bipolar logic levels to FET logic levels. More particularly, this invention relates to a circuit for converting transistor transistor logic (TTL logic levels) to FET logic levels.

2. Description of the Prior Art

A number of circuits are known in the prior art for converting TTL logic levels to FET logic levels. The need for such converter circuits arises because both TTL and FET circuits are used in modern data processing systems. An interface circuit to convert from one set of logic voltage levels to another is therefore a standard requirement. Main memories for data processing systems are frequently fabricated with FETs in integrated circuit form and have advantages of dense integration and low power dissipation. Bipolar logic circuits, however, have a higher operating speed and it therefore becomes advantageous to form the control logic circuits for the main memory from bipolar transistors in circuit configurations such as TTL. Thus, there is a continuing need for improved interfaces between bipolar and FET circuits to overcome otherwise incompatible logic voltage levels.

As mentioned, one form of digital circuit fabricated from bipolar transistors is the so called TTL logic system. In TTL, one binary state, e.g. the logic "0" is usually represented by a voltage in the range of 0 to 0.8 volts. The other binary state, e.g. the logic "1" is represented by a voltage in the range of 2.0 volts to as high as 5.5 volts. By way of comparison, FET circuits normally operate in the range of 0 to 8.5 volts.

The prior art is exemplified by E. ARAI and N. IEDA in the June 1978 issue of the IEEE Journal of Solid-State Circuits, Vol SC-13, No. 3, pages 333–338. This article describes a circuit for converting TTL levels into FET levels particularly at section IV, pages 335 and 336 and FIG. 5. The field effect transistors used in this published level converter are assumed to have a threshold voltage VT of 0.8 volts which is near the maximum value of 0.8 volts for the down level TTL signal. For this reason, in order to prevent the input FET from becoming conductive when noise pulses are added to this already high level, the source potential of the FET is raised by a voltage divider circuit. Thus, the input FET becomes conductive only when the applied signal is higher than the sum of its source bias and its threshold voltage. Although this technique eliminates the effect of noise pulses on the switching characteristics of the input FET, it also prevents the FET from conducting until it receives an input signal sufficiently high to overcome the effect of the bias on the source of the input FET. For example, if the source of the input FET is raised to 0.7 volts and the threshold voltage is 0.8 volts, then the input must be over 1.5 volts to cause the input FET to conduct. A disadvantage of this arrangement becomes apparent when it is noted that the lowest possible up level of a TTL signal is 2.0 volts and this 0.5 volts differential (between 2.0 and 1.5) is insufficient to turn the input FET fully on. Thus, the proposed solution to the TTL to FET conversion problem at the low logic level creates another problem at the high logic level. The problem at the high logic level could be solved by a requirement that the lowest possible high logic level be greater than 2.0 volts. This, however, would require still an additional circuit to convert from standard TTL logic levels to this new up level which is greater than 2.0 volts. Another problem that remains unsolved with this particular prior art circuit is that the threshold voltage of FETs fabricated in integrated circuit form cannot be made with consistent thresholds of 0.8 volts. Due to manufacturing tolerances, the threshold voltage of FETs varies significantly from one integrated circuit chip to another.

SUMMARY OF THE INVENTION

It is accordingly an object of the present invention to provide an improved TTL to FET converter using field effect transistors.

It is another object of this invention to provide a TTL to FET converter circuit that is independent of threshold voltage variations.

It is a still further object of the this invention to provide an improved field effect transistor circuit for converting bipolar transistor logic levels to field effect transistor logic levels with minimal power dissipation.

The objects, features and advantages of this invention are provided by a circuit which effectively cancels out the threshold voltage term from the required control voltage equation. This is accomplished with an arrangement of field effect transistors in which first and second of these transistors have their source and gate electrodes connected in common. The TTL input signal is applied to the common source connection while the common gate connection is biased to a fixed potential that is equal to the sum of the lowest possible up level of the TTL logic plus the threshold voltage VT of the first and second field effect transistors. The drain of the second field effect transistor is connected to a boot strap load device including third and fourth transistors with a boot strap capacitor, and is also connected to the gate of one of a pair of series connected field effect transistors. The drain of the first FET is connected to the common node between the pair of series connected field effect transistors which are connected in a series electrical path between the supply terminals (VH and ground) of the FET circuit. The common connection of the pair of FETs forms the output of the converter which is then supplied to a power inverter, one output of the power inverter controlling the gate electrode of the other one of the pair of series connected field effect transistors.

As will be described in greater detail herein below, this arrangement not only performs the TTL to FET logic level conversion independent of the threshold voltage of the FET devices, but also dissipates minimal power by limiting DC current paths across the power supply terminals. Current at the input terminal is negligible when the high logic level is received at the input and is minimized when the low logic level appears at the input by properly dimensioning the FETs of the converter circuit.

The foregoing and other objects, features and advantages of this invention will be apparent from the following and more detailed description of a preferred embodiment of the invention as illustrated in the accompanying drawings.

DESCRIPTION OF THE PREFERRED EMBODIMENT

Figure 1:
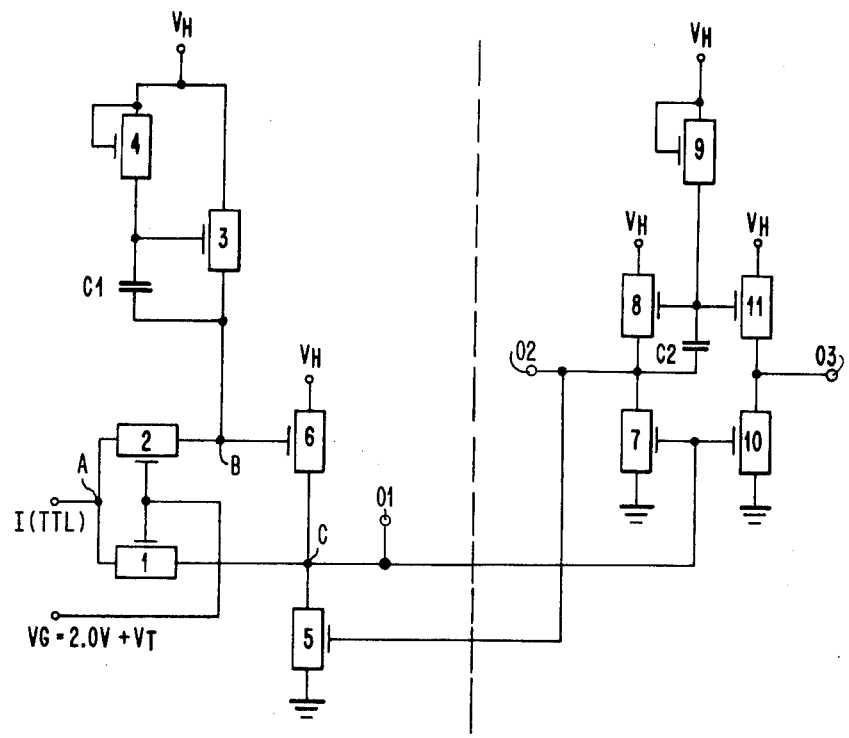
FIG. 1 is a schematic circuit diagram of the preferred embodiment of the present invention.

In the circuit diagram of FIG. 1, the use of conventional N channel MOS FETs is assumed. The potential VH is approximately 8.5 volts. It is of course understood that equivalent circuit embodiments comprising P channel devices, depletion mode devices, low threshold devices, etc. and combinations of these will become apparent to those skilled in the art as obvious extensions of this invention.

In the circuit diagram of FIG. 1, the level converter of this invention is shown to the left of the dashed lines in combination with the known inverting FET power amplifier to the right of the dashed lines. The inverting FET power amplifier to the right of the dashed lines is shown in the above referenced German OS. Briefly, the FET power amplifier receives an input at the common gate connection of FETs 7 and 10 which have their source electrodes connected to ground potential. FETs 8 and 11 are the load devices for signal FETs 7 and 10, respectively and have their gate electrodes connected in common while their drain electrodes are connected to VH. The common gate connection of FETs 8 and 11 is connected to VH by way of diode connected FET 9. C2 is a boot strap capacitor providing a boot strapped up level output at output terminal O2 by way of FET 8 and also a boot strapped up level output at output terminal O3 by way of FET 11.

The level converter to the left of the dashed lines in FIG. 1 will now be described. The bipolar logic level (e.g. TTL) is received at terminal I at node A which forms a common connection for the source electrodes of FET 1 and 2. The gate electrodes of FET 1 and 2 are connected in common and to a reference potential at terminal VG. The drain of FET 2 is connected to node B. Node B is connected to terminal VH by means of load device 3 which is a boot strapped load device by way of gate to source capacitor C1 and diode connected FET 4. The output O1 of the converter circuit is provided by the common connection at node C of the drain of FET 1 and FETs 5 and 6 connected in a series electrical path between VH and ground. The gate of FET 6 is connected to node B while the gate of FET 5 is connected to output O2 of the power inverter. The output O1 of the converter circuit provides an input at the gates of FETs 7 and 10 in the power inverter circuit.

The reference voltage VG is generated in a conventional manner by a voltage divider circuit provided on the same semiconductor chip. For example, the reference voltage is generated by a voltage divider with a resistance connected to terminal VH and a diode connected FET (having the gate and drain electrode connected in common to the other side of the resistive element). The source electrode of the diode connected FET is connected to a common connection between two resistive elements that are connected in a series path between VH and ground potential. These last two mentioned resistive elements are adjusted to provide a source bias that is equal to the lowest possible up level of the TTL logic signal. In the present example, it has been assumed that the up level of the TTL logic signal is between 2.0 and 5.5 volts so that the lowest possible up level is 2.0 volts to which the source of the diode connected FET is biased. In this way, the drain of the diode connected FET will be one threshold voltage (VT) above the 2.0 volts, hence VG equals 2.0 volts plus VT. Of course, a higher (or lower) reference voltage is obtainable merely by adjusting the voltage divider which sets the voltage of the source electrode of the diode connected FET. The important aspect of this arrangement is that the threshold voltage VT of the diode connected FET being on the same chip with the other FET circuits will always set the reference voltage VG in a correct relationship with the threshold voltage of the devices on the chip.

OPERATION

With continued reference to FIG. 1 and also referring to FIG. 2, the operation of the circuit will now be described. Assume first that the TTL input at terminal I is at a low logic level (in the range of 0 to 0.8 volts). For this specific example, assume the most positive down level (worst case) 0.8 volts is applied to the common source connection at node A. Since the gate electrodes of FETs 1 and 2 are set at 2.0 volts plus VT, the applied common gate-source voltage (VGS) is 1.2 volts plus the threshold voltage VT of the particular device. Assuming a VT of 1.5 volts, this voltage of 2.7 volts is more than adequate to bias FET 1 and FET 2 fully on. Of course, if the down level is less than 0.8 volts, e.g. 0 volts, then the applied gate to source voltage VGS becomes 2.0 volts plus the threshold voltage VT, e.g. 3.5 volts.

For the present example in which the reference voltage VG is 2.0 V plus VT and the potential (VS) applied at node A is 0.8 volts, the equation for the control voltage VGS minus VT is derived by the following formula:

$$\begin{aligned} VGS - VT &= VG - VS - VT \\ &= 2.0\ V + VT - 0.8\ V - VT \\ &= 1.2\ V \end{aligned}$$

The above equation demonstrates the advantage of the present invention in eliminating the dependency on the threshold voltage VT in determining the conductivity or non-conductivity of the input FETs 1 and 2. As noted at line 2 of the equation, the term VT appears twice on the right hand side of the equation and cancels out.

Continuing with the present example that 0.8 volts has been applied to node A, node B is brought to a down level that is only slightly above 0.8 volts. The voltage at node B is determined by the voltage divider effect of FET 3 (which is on) and FET 2. The dimensions of FET 3 and FET 2 are tailored so that FET 3 has a higher impedance in its on state than FET 2 to achieve a voltage near 0.8 volts at node B. The total impedance of FET 3 plus FET 2 in their on states determines the current flow required in a down level input situation. The potential at node B (slightly in excess of 0.8 volts) is sufficient to turn off FET 6. Reliable cutoff of FET 6 is assured by the fact that its source electrode at node C is brought up by the voltage divider effect of FET 1 and FET 5. Note that FET 1 was turned on simultaneously with FET 2 bringing node C up to at least 0.5 volts so that the gate to source bias on FET 6 is approximately 0.3 volts, sufficient to assure that it is rendered non-conductive.

Thus, even if node C and output O1 were previously at an up level, they are brought to a sufficient down level to turn off FET 7 and FET 10. This permits output O2 and output O3 to charge to up levels through FET 8 and FET 11, respectively. Moreover, the boot strap effect of capacitor C2 permits O2 and O3 to rise fully to VH. An important feature of this invention is the positive feedback connection from output terminal O2 to the gate of FET 5 which turns FET 5 fully on, thereby accelerating the discharging of node C. This increases the switching speed of the power amplifier by speeding up the cut-off of FET 7 and FET 10. Of course, connecting the gate of FET 5 to output terminal O3 produces the identical result. In either case as soon as the voltage applied to the gate of FET 5 exceeds the threshold voltage, FET is rendered conductive accelerating the reduction of the gate voltage for drive FETs 7 and 10. By this positive feedback technique, it is assured that even with a high down level input of 0.8 volts, the binary state is readily switched and terminal O1 is brought to near 0 volts.

Assume next that the input potential applied to node A is brought from 0.8 volts to 2.0 volts, the lowest possible up level for TTL signal levels. Since the gate electrodes of FET 1 and FET 2 are biased to 2.0 volts plus VT, the gate to source bias differential is precisely VT, insufficient to maintain them conductive. This condition is best understood by the following formula:

$$VGS - VT = VG - VS - VT$$
$$= 2.0 V + VT - 2.0 V - VT$$
$$= 0$$

This, of course, is worst case. If a higher potential is applied at node A, cutoff would be similarly assured. With FET 2 off, node B charges up to potential VH through boot strapped load device node 3. This turns FET 6 on to charge node C to one threshold voltage VT below VH. This turns FET 7 and FET 10 on bringing outputs O2 and O3 down to 0 volts. The positive feedback connection from O2 to the gate of FET 5 cuts FET 5 off completing the transition to a binary "1".

Figure 2:
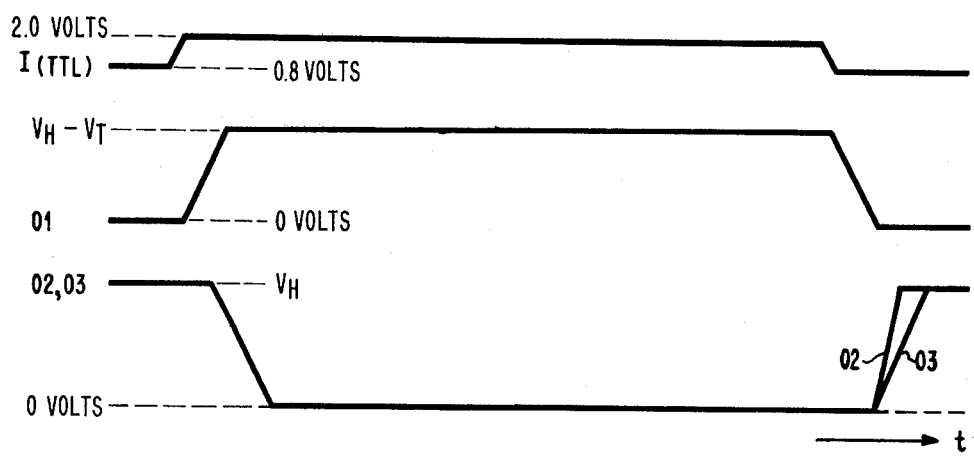
FIG. 2 is a series of waveform diagrams depicting the operation of the circuit of FIG. 1.

With continued reference to FIGS. 1 and 2, the foregoing explanation is also demonstrated by the waveform diagrams. When the input terminal I (TTL) rises from 0.8 volts to 2.0 volts, the output O1 rises from 0 volts to 1 threshold voltage below VH (with a slight delay). The outputs O2 and O3 are then brought from VH to 0 volts (also with a slight delay). This stady-state condition continues until the input terminal I is brought back to a down level, at which time output O1 is brought back to 0 volts and outputs O2 and O3 are charged to VH.

In accordance with the foregoing, the disclosed level converter, through the combined action of FET 2, boot strap FET 3, and output load FET 6 converts a TTL level of 2.0 volts quickly into a high voltage (VH minus VT at node C) which at approximately 7 volts (8.5-1.5 volts) is clearly higher than the upper limit of the FET threshold voltage VT of approximately 1.5 volts. Signal FETs 7 and 10 in the inverting FET power amplifier are therefore both highly conductive so that outputs O2 and O3 are brought to a potential just slightly above ground. As this potential is fed back to the gate of discharge FET 5, FET 5 is rendered non-conductive. Thus, there is no DC power dissipation as there is no DC path from VH to ground through FET 6 and FET 5. (Of course, the power inverter on the right side of the dashed line does dissipate DC power.)

In conclusion, the present circuit provides reliable conversion of TTL levels having a down level as high as 0.8 volts and an up level as low as 2.0 volts into FET levels in the order of 0 volts to 8.5 volts for the down and up binary levels, respectively. This is accomplished regardless of whether the threshold voltage of the illustrated FETs is low (e.g. 0.5 volts) or high (e.g. 1.5 volts). The required input currents are also TTL-compatible since there is virtually no input current required for the up level. The down level TTL input at terminal I results in a current flow which is limited by the resistance in the on state of series connected FET 3, FET 2 and the series arrangement of FET 1 and FET 5. These FET devices can be properly dimensioned to limit the required TTL input current.

While the invention has been shown and particularly described with reference to a preferred embodiment, it will be understood by those skilled in the art that various changes in form and detail may be made therein without departing from the spirit and scope of the invention.

What is claimed is:

1. A field effect transistor circuit for converting bipolar transistor logic levels to field effect transistor logic levels independent of field effect transistor threshold voltage variations, comprising:

first and second field effect transistors each having a gating electrode and first and second gated electrodes and having their respective gating electrodes and first gated electrodes connected in common;

means for biasing said gating electrodes of said first and second transistors connected in common to a reference potential;

an input terminal connected to said first gated electrodes of said first and second field effect transistors connected in common;

the second gated electrode of said first field effect transistor being connected to an output terminal and to a first gated electrode of a third field effect transistor;

the second gated electrode of said second field effect transistor being connected to a load device and to a gating electrode of said third field effect transistor;

a second gated electrode of said third field effect transistor and said load device being connected to a first potential source; and a fourth field effect transistor having a gating electrode and first and second gated electrodes, the second gated electrode of said fourth field effect transistor being connected to said output terminal, the first gated electrode of said fourth field effect transistor being connected to a second potential source, and the gating electrode of said fourth field effect transistor being connected to an output of a power inverting circuit having its input coupled to said output terminal.

2. A field effect transistor circuit as in claim 1 wherein said power inverting circuit comprises:

a field effect transistor power inverting circuit having an input and at least two outputs, with said input being directly connected to said output terminal and with one of said at least two outputs being directly connected to the said gating electrode of said fourth field transistor, said last mentioned connection forming a positive feedback path.

3. A field effect transistor circuit as in claim 1 wherein said means for biasing the common gating electrode to a reference potential biases the common gating electrode to a potential level substantially equal to the sum of logical up level signals applied at the input terminal plus the threshold voltage of said first and second field effect transistors.

4. A field effect transistor circuit as in claim 1 wherein said load device comprises:
 a fifth field effect transistor connected in a series electrical path between said first potential source and the common connection of the second gated electrode of said second field effect transistor and the gating electrode of said third field effect transistor;
 a bootstrap capacitor electrically coupling the gate and source electrodes of said fifth field effect transistor; and
 a diode connected field effect transistor connected in a series electrical path between said first potential source and the gate electrode of said fifth field effect transistor.

5. A field effect transistor logic circuit for converting first binary logic levels to second binary logic levels comprising:
 a plurality of field effect transistors each having a gating electrode, a source electrode, and a drain electrode, formed on an integrated circuit chip and having substantially the same threshold voltage;
 first and second of said plurality of field effect transistors being connected in a series electrical path between first and second sources of potential, the source electrode of said first field effect transistor being connected to the drain electrode of said second field effect transistor and forming a common circuit point;
 an input terminal adapted to receive logic signals at said first binary logic levels;
 third of said plurality of field effect transistors connected in a series electrical path between said input terminal and the said gating electrode of said first field effect transistor;
 fourth of said plurality of field effect transistors connected in a series electrical path between said input terminal and said common circuit point forming a direct current connection between said input terminal and said common circuit point when said fourth of said plurality of field effect transistors is in its conductive state;
 a bias signal potential connected to the gating electrodes of both said third and fourth field effect transistors for applying a bias potential substantially equal to the sum of the logical level signal applied at said input terminal and the said threshold voltage of said field effect transistors;
 a load connected between said first source of potential and the gating electrode of said first field effect transistor and
 circuit means formed of additional field effect transistors of said plurality of field effect transistors having an input connected to said common circuit point and an output connected to the gating electrode of said second field effect transistor.

6. A field effect transistor logic circuit as in claim 5 wherein said load comprises:
 a bootstrapped field effect transistor.

7. A field effect transistor logic circuit as in claim 5 wherein said additional field effect transistors comprise:
 a field effect transistor inverting circuit forming a positive feedback path.

* * * * *